(12) United States Patent
Lee

(10) Patent No.: US 7,304,599 B2
(45) Date of Patent: Dec. 4, 2007

(54) ANALOG-TO-DIGITAL CONVERTER WITH REDUCED POWER CONSUMPTION IN CMOS IMAGE SENSOR

(75) Inventor: Myoung-Su Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/488,509

(22) Filed: Jul. 18, 2006

(65) Prior Publication Data

US 2007/0030190 A1 Feb. 8, 2007

(30) Foreign Application Priority Data

Aug. 5, 2005 (KR) .................. 10-2005-0071754

(51) Int. Cl.
*H03M 1/58* (2006.01)
(52) U.S. Cl. ................ 341/169; 341/164; 341/170
(58) Field of Classification Search ............ 341/164, 341/165, 169, 170, 155; 348/294, 308, 348
See application file for complete search history.

(56) References Cited

U.S. PATENT DOCUMENTS

| | | | | |
|---|---|---|---|---|
| 6,144,330 A | * | 11/2000 | Hoffman et al. | 341/166 |
| 6,518,909 B1 | * | 2/2003 | Yang et al. | 341/155 |
| 6,542,105 B2 | * | 4/2003 | Sakuragi | 341/164 |
| 6,677,880 B2 | * | 1/2004 | Yamamoto | 341/169 |
| 6,788,237 B1 | * | 9/2004 | Bidermann et al. | 341/155 |
| 6,867,804 B1 | * | 3/2005 | Kim et al. | 348/294 |
| 7,075,470 B2 | * | 7/2006 | Lee | 341/155 |

OTHER PUBLICATIONS

Japanese Patent Application No. 11-035765 to Toru, having Publication date of Aug. 29, 2000 (w/ English Abstract page).
Japanese Patent Application No. 01-067608 to Akifumi, having Publication date of Oct. 3, 1990 (w/ English Abstract page).
Japanese Patent Application No. 03-056321 to Makoto, having Publication date of Mar. 5, 1993 (w/ English Abstract page).
Japanese Patent Application No. 10-374422 to Toshiro, having Publication date of Jul. 14, 2000 (w/ English Abstract page).
Japanese Patent Application No. 11-223079 to Koji, having Publication date of Feb. 23, 2001 (w/ English Abstract page).

* cited by examiner

*Primary Examiner*—Linh Nguyen
(74) *Attorney, Agent, or Firm*—Monica H. Choi

(57) ABSTRACT

An analog-to-digital converter includes a comparator, a latch, and a bias control unit. The comparator is turned on by an applied bias voltage for comparing an analog voltage with a ramp voltage. The latch activates an end signal when the ramp voltage becomes greater than the analog voltage as indicated by the comparator. The bias control unit uncouples the bias voltage from the comparator when the end signal is activated for reducing power consumption.

22 Claims, 3 Drawing Sheets

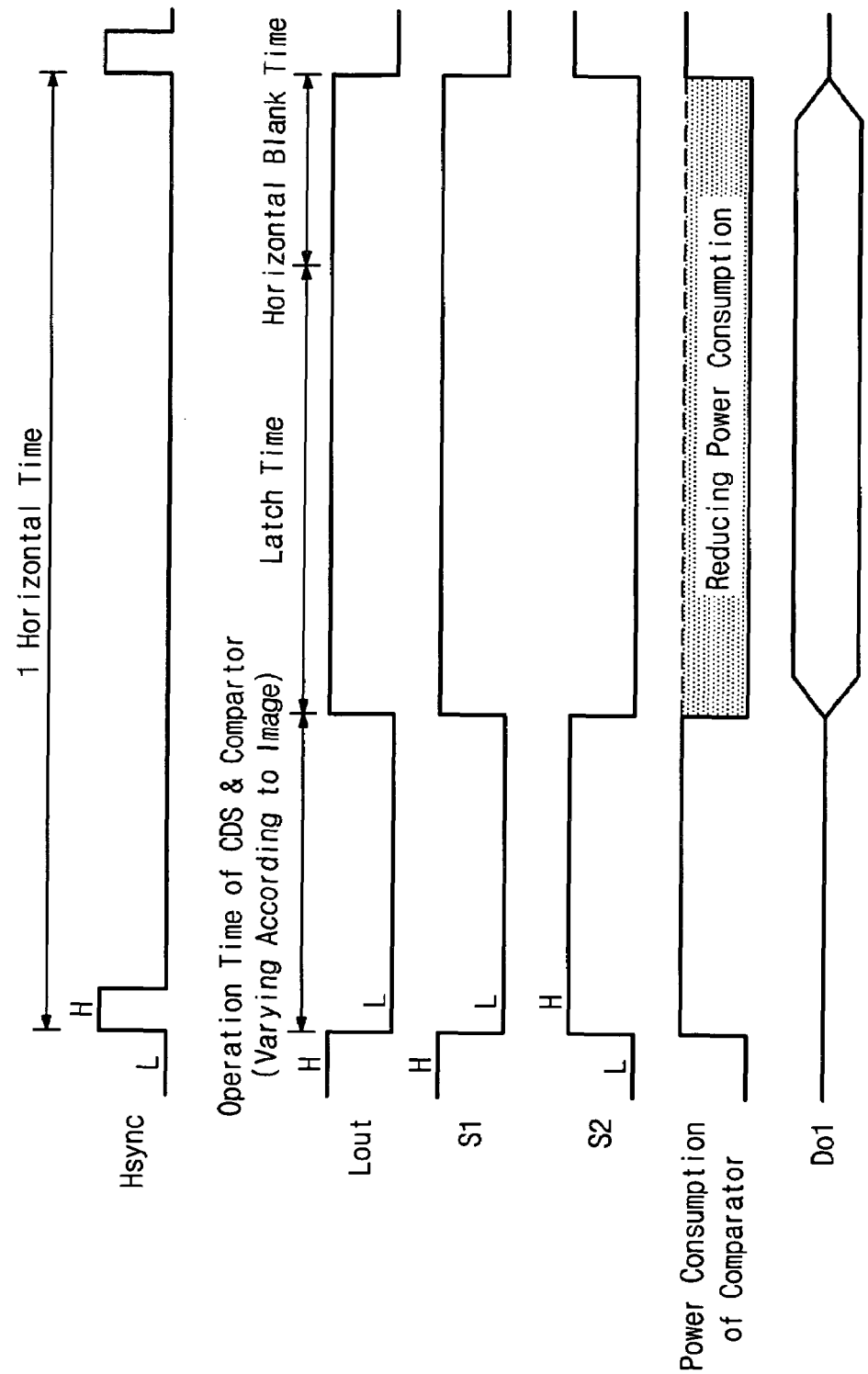

ANALOG-TO-DIGITAL CONVERTER WITH REDUCED POWER CONSUMPTION IN CMOS IMAGE SENSOR

BACKGROUND OF THE INVENTION

This application claims priority to Korean Patent Application No. 2005-71754, filed on Aug. 5, 2005 in the Korean Intellectual Property Office, the disclosure of which is incorporated herein in its entirety by reference.

FIELD OF THE INVENTION

The present invention relates generally to analog-to-digital converters in CMOS (complementary metal oxide semiconductor) image sensors, and more particularly, to reducing power consumption in such an analog-to-digital converter.

DESCRIPTION OF THE RELATED ART

An Image sensor converts an image into electrical signals using photo-conversion. An image sensor is generally classified into either a charge-coupled device (CCD) type or a complementary metal-oxide-semiconductor (CMOS) image sensor (CIS) type depending on the mechanism for generating and transferring charge carriers.

The CCD image sensor transfers electrons generated from incident light to an output port using gate pulses, and such transferred electrons are then transformed into a voltage. The CCD image sensor has relatively high optical sensitivity with reduced noise because an optical current is extracted after an accumulation time. However, the CCD image sensor disadvantageously has a complicated driving mechanism for continuous transfer of charge carriers. Additionally, the CCD image sensor consumes relatively high power.

The CMOS image sensor transforms electrons generated by incident light into a voltage in a pixel circuit. Such a voltage is output through a plurality of CMOS switches. The CMOS image sensor is generally inferior to the CCD image sensor in electro-optical characteristics. However, the CMOS image sensor has lower power consumption and higher integration density than the CCD image sensor.

In the CMOS image sensor, charge carriers are accumulated for a relatively short period of time before being converted into a voltage within each pixel circuit. Thus, such a voltage is more sensitive to noise as the voltage signal is generated and transmitted. A high quality CMOS image sensor uses a differential comparator within an analog-to-digital converter for reducing power noise and coupling noise.

However, a differential comparator has higher power consumption compared to using single ended inverting amplifiers because the differential comparator continuously consumes current in the prior art. Nevertheless, the differential comparator advantageously reduces noise in the CMOS image sensor. Thus, an analog-to-digital converter that uses a differential comparator with reduced power consumption is desired for enhanced quality of a CMOS image sensor.

SUMMARY OF THE INVENTION

Accordingly, embodiments of the present invention provide reduced power consumption in an analog-to-digital converter having a differential comparator.

An analog-to-digital converter according to an aspect of the present invention includes a comparator, a latch, and a bias control unit. The comparator is turned on by an applied bias voltage for comparing an analog voltage with a ramp voltage. The latch activates an end signal when the ramp voltage becomes greater than the analog voltage as indicated by the comparator. The bias control unit uncouples the bias voltage from the comparator when the end signal is activated. In that case, the comparator becomes deactivated when the bias voltage is uncoupled, for reducing power consumption.

In an embodiment of the present invention, the analog-to-digital converter further includes a counter that counts in binary from when the ramp voltage starts to ramp up until the end signal is activated, for generating a digital signal corresponding to the analog voltage.

In a further embodiment of the present invention, the analog-to-digital converter includes a CDS (correlated double sampling) unit that generates the analog voltage as a difference between a reset voltage and a data voltage.

In another embodiment of the present invention, the bias control unit includes a switch having a first terminal with the bias voltage applied thereon. Such a switch also has a second terminal coupled to the comparator, and the switch is controlled to be opened by the activated end signal.

In a further embodiment of the present invention, the comparator includes first and second differential comparators. The first differential comparator has inputs having the analog and ramp voltages applied thereon. The second differential comparator has inputs coupled to outputs of the first differential comparator, and an output of the second differential comparator transitions when the ramp voltage becomes greater than the analog voltage.

In another embodiment of the present invention, the first differential comparator includes a first differentially coupled pair of transistors and a first bias transistor having a gate couple to the bias control unit. The second differential comparator includes a second differentially coupled pair of transistors and a second bias transistor having a gate couple to the bias control unit.

In that case, the first differential comparator further includes a first charge dissipation transistor coupled to the first bias transistor, and the second differential comparator further includes a second charge dissipation transistor coupled to the second bias transistor. The first and second charge dissipation transistors are turned on when the end signal is activated for dissipating charge from the first and second bias transistors.

In a further embodiment of the present invention, the analog-to-digital converter also includes an input fixing unit that couples a predetermined voltage to an input of the latch such that the latch maintains the end signal to be activated after the bias voltage is uncoupled from the comparator.

For example, the input fixing unit includes a switch having a first terminal with the predetermined voltage applied thereon. Such a switch also includes a second terminal coupled to the input of the latch, and the switch is controlled to be closed by the activated end signal.

The present invention may be used to particular advantage when the analog-to-digital converter is formed within a CMOS (complementary metal oxide semiconductor) image sensor with the analog voltage indicating a gray scale level sensed by a photo-diode. In that case, the comparator is turned on for a portion of every horizontal scan time period.

In addition, the analog-to-digital converter of embodiments of the present invention may be used for any other applications or in any other electronic devices having analog-to-digital conversion.

BRIEF DESCRIPTION OF THE DRAWINGS

The above and other features and advantages of the present invention will become more apparent when described in detailed exemplary embodiments thereof with reference to the attached drawings in which:

FIG. 3 is a timing diagram of signals during operation of the circuit in FIG. 2, according to an embodiment of the present invention.

The figures referred to herein are drawn for clarity of illustration and are not necessarily drawn to scale. Elements having the same reference number in FIGS. 1, 2, and 3 refer to elements having similar structure and/or function.

DETAILED DESCRIPTION OF THE INVENTION

Figure 1:
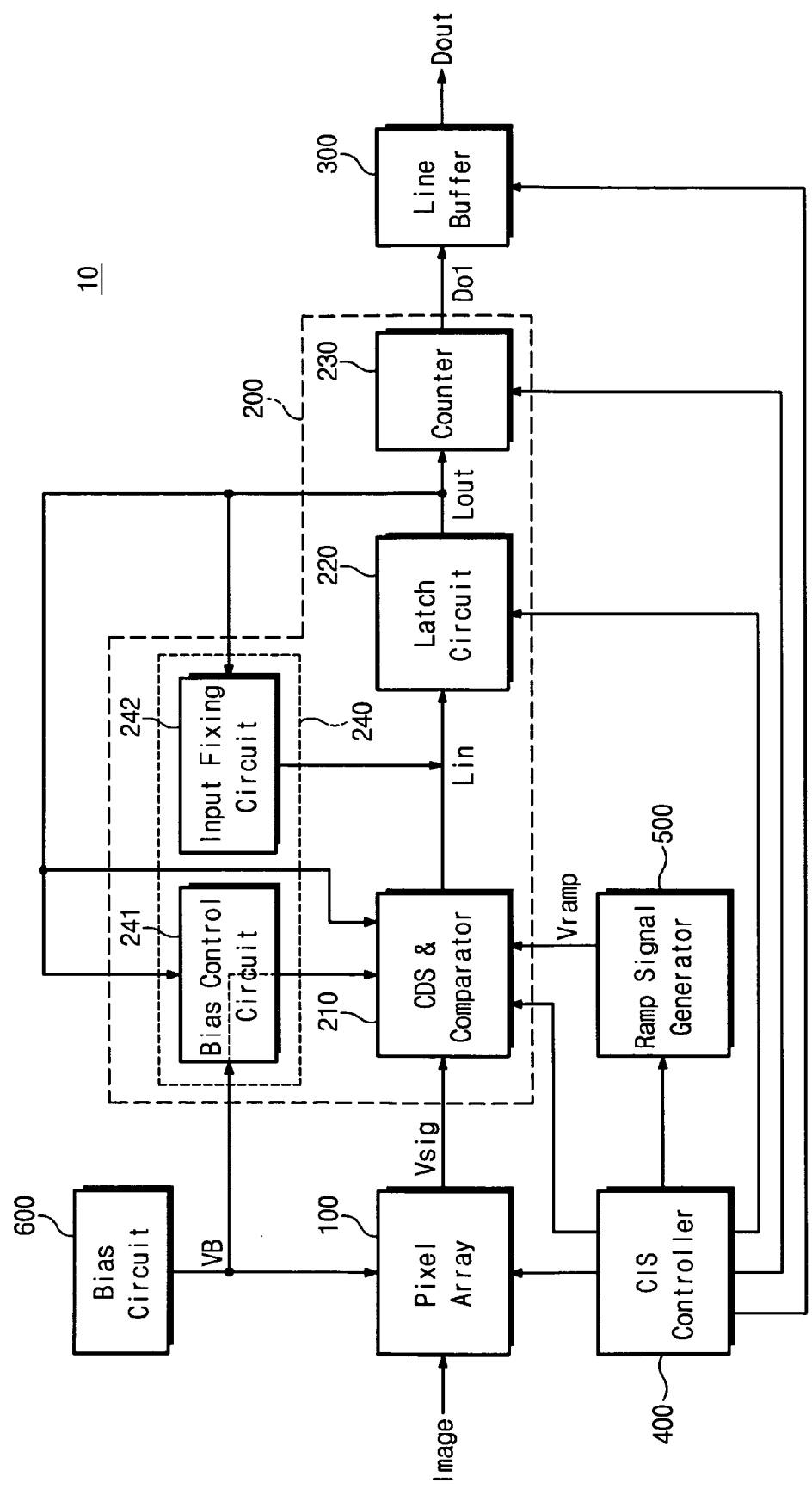
FIG. 1 is a block diagram of a CMOS image sensor having an analog-to-digital converter with reduced power consumption, according to an embodiment of the present invention.

FIG. 1 is a block diagram of a CMOS (complementary metal oxide semiconductor) image sensor (CIS) 10 according to an embodiment of the present invention. The CMOS image sensor 10 includes a pixel array 100, an analog-to-digital converter 200, a line buffer 300, a CIS (CMOS image sensor) controller 400, a ramp signal generator 500, and a bias circuit 600.

The pixel array 100 is formed with a plurality of unit pixel circuits for receiving an image to generate electrical signals. Each unit pixel circuit includes a photodiode that converts incident light into a data signal voltage Vdata. The pixel array 100 is driven by a bias voltage VB.

The analog-to-digital converter 200 receives a reset voltage Vres and the data signal voltage Vdata from the pixel array 100. The analog-to-digital converter 200 then generates an analog signal voltage Vsig as a difference between the reset and data voltages Vres and Vdata for CDS (Correlated Double Sampling).

The analog signal voltage Vsig indicates a gray scale level of the light incident on the photodiode of the pixel array 100. The analog-to-digital converter 200 converts such an analog signal voltage Vsig into a digital signal. The analog-to-digital converter 200 includes a CDS (Correlated Double Sampling) comparator 210, a latch unit 220, a counter 230, and a power saving unit 240. The power saving unit 240 includes a bias control unit 241 and an input fixing unit 242.

Figure 2:
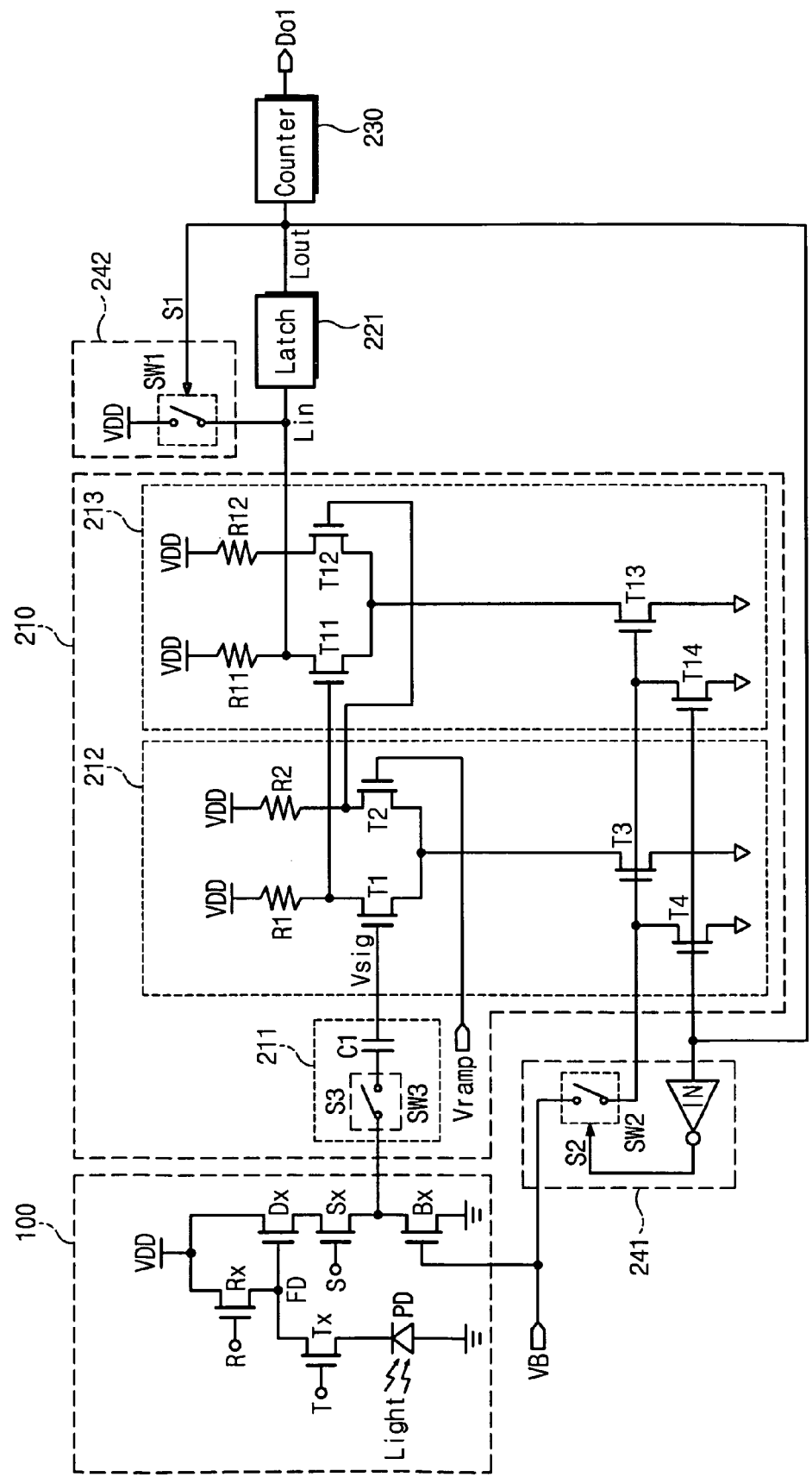
FIG. 2 is a circuit diagram of a pixel circuit and the analog-to-digital converter in FIG. 1, according to an embodiment of the present invention.

FIG. 2 is circuit diagram of an example pixel circuit 100 and the analog-to-digital converter 200 in FIG. 1, according to an embodiment of the present invention. The pixel array 100 is comprised of an array of more numerous pixel circuits. However, one example pixel circuit 100 is illustrated in FIG. 2 for simplicity and clarity of illustration and description.

The example pixel circuit 100 in FIG. 2 includes a photo diode PD, a transfer transistor TX, a drive transistor DX, a reset transistor RX, a select transistor SX, and a bias transistor BX. The photodiode PD converts incident light for an image into charge carriers, and the amount of such generated charge carriers is dependent on the intensity of such incident light. The photodiode PD is coupled between the transfer transistor TX and a ground node. A bias current is generated through the bias transistor BX from the bias voltage VB applied on a gate of the bias transistor BX.

The transfer transistor TX when turned on by the T control signal transfers charge carriers generated by the photodiode PD to a floating diffusion node FD. The drive transistor DX generates a source-to-drain current that is proportional to such transferred charge carriers at the gate of the drive transistor DX. The reset transistor RX when turned on by the R control signal applies the high power voltage VDD on the floating diffusion node FD.

The selection transistor SX when turned on by the S control signal for selecting the pixel circuit 100 transfers the current of the drive transistor DX to the CDS comparator 210. The T, R, and S control signals applied on the gates of the transfer transistor TX, the reset transistor RX, and the selection transistor SX, respectively, are generated by the CIS controller 400 of FIG. 1.

Further referring to FIG. 2, the CDS comparator 210 includes a CDS (correlated double sampling) unit 211, a first differential comparator 212, and a second differential comparator 213. The CDS unit 211 includes a sampling capacitor C1 and a sampling switch SW3 that is controlled by a switch control signal S3 generated by the CIS controller 400 of FIG. 1.

One terminal of the sampling switch S3 is coupled to the pixel circuit 100, and the other terminal of the sampling switch S3 is coupled to one terminal of the sampling capacitor C1. The other terminal of the sampling capacitor C1 is coupled to one input of the first differential comparator 212. The CIS controller 400 controls the switching of the sampling switch SW3 such that the analog signal voltage Vsig that is a difference between the reset voltage Vres and the data voltage Vdata is generated at the terminal of the switching capacitor C1 coupled to the first differential comparator 212.

The pixel circuit 100 outputs the reset voltage Vres after the reset transistor Rx is turned on to couple a high power voltage VDD to the floating diffusion node FD. The pixel circuit 100 outputs the data voltage Vdata after the transfer transistor TX is turned onto transfer charge carriers generated by the photo-diode PD to the floating diffusion node FD.

The first differential comparator 212 also receives a ramp voltage Vramp from the ramp signal generator 500 as another input. The first differential comparator 212 includes a first differentially coupled pair of field effect transistors T1 and T2 having sources coupled together. The gates of the transistors T1 and T2 have the analog signal voltage Vsig and the ramp voltage Vramp, respectively, applied thereon. The drain of the transistor T1 is coupled to the high power voltage VDD via a first resistor R1, and the drain of the transistor T2 is coupled to the high power voltage VDD via a second resistor R2.

A first bias transistor T3 is coupled between the sources of the transistors T1 and T2 and a ground node. A first charge dissipation transistor T4 is coupled between a gate of the first bias transistor T3 and the ground node. The gate of the first bias transistor T3 is coupled to the bias control unit 241, and the gate of the first charge dissipation transistor T4 is coupled to an output of a latch 221. The latch 221 is part of the latch unit 220 of FIG. 1, and the latch 221 generates an end signal Lout at its output.

Differential outputs of the first differential comparator 212 are formed at the drains of transistors T1 and T2. Such outputs of the first differential comparator 212 are coupled to inputs of the second differential comparator 213.

The second differential comparator 213 includes a second differentially coupled pair of field effect transistors T11 and T12 having sources coupled together. The gates of the transistors T11 and T12 have the outputs of the first differential comparator 212 coupled thereto. The drain of the transistor T11 is coupled to the high power voltage VDD via a corresponding resistor R11, and the drain of the transistor T12 is coupled to the high power voltage VDD via a corresponding resistor R12.

A second bias transistor T13 is coupled between the sources of the transistors T11 and T12 and a ground node. A second charge dissipation transistor T14 is coupled between a gate of the second bias transistor T13 and the ground node. The gate of the second bias transistor T13 is coupled to the bias control unit 241, and the gate of the second charge dissipation transistor T14 is coupled to the output of the latch 221.

The bias control unit 241 includes a control switch SW2 with one terminal having the bias voltage VB applied thereon. The other terminal of the control switch SW2 is coupled to the gates of the bias transistors T3 and T13. A control signal S2 for controlling the control switch SW2 is an inverse of the end signal Lout from the latch 221, as generated by the inverter IN.

The input fixing unit 242 includes a fixing switch SW1 having a terminal with the high power voltage VDD applied thereon. In addition, the other terminal of the fixing switch SW1 is coupled to the input of the latch 221. A control signal S1 for controlling the fixing switch SW1 is the end signal Lout from the latch 221. The end signal Lout from the latch 221 is also input by the counter 230.

FIG. 3 is a timing diagram of signals during operation of the circuit of FIG. 2, according to an example embodiment of the present invention. A horizontal synchronization signal Hsync is generated from the CIS controller 400 in FIG. 1. One horizontal scan time period of the Hsync signal is for reading data of one row line of the pixel array 100. A horizontal scan pulse with a logic high state H is generated for each one horizontal scan time period of the Hsync signal.

At the beginning of such a pulse, the ramp voltage Vramp is not yet ramped up and has a relatively low constant level. Thus, Vramp is less than Vsig applied at the gate of T1 such that the end signal Lout from the latch 221 is deactivated to a logic low state L. Such a deactivated end signal Lout turns on the control switch SW2 such that the bias voltage VB is applied on the bias transistors T3 and T13. The bias transistors T3 and T13 are thus turned on to cause bias currents to flow through the differential comparators 212 and 213.

In addition, the CIS controller 400 controls the pixel circuit 100 and the CDS unit 211 such that the analog signal voltage Vsig is generated at the gate of the transistor T1. The analog signal voltage Vsig is a difference of the reset voltage Vres and the data voltage Vdata generated from the pixel circuit 100 as already described herein.

Thereafter, the CIS controller 400 controls the ramp signal generator 500 to begin ramping up the ramp voltage Vramp. In one embodiment of the present invention, the ramp voltage Vramp ramps up linearly with time. Furthermore, the CIS controller 400 controls the counter to begin counting as soon as the ramp voltage Vramp begins to ramp up with time.

The ramp voltage Vramp ramping up with time eventually causes the end signal Lout to become activated to the logic high state H when the ramp voltage Vramp becomes greater than the analog signal voltage Vsig. The counter 230 stops counting when the end signal Lout is activated. The time period from when the ramp voltage Vramp begins to ramp up until the end signal Lout is activated varies with the level of the analog signal voltage Vsig.

Thus, such a time period indicates a gray scale level of the incident light as detected by the photodiode PD. For example, the end signal Lout is activated later for a darker image. The counter 230 generates a binary count indicating the duration of such a time period, and the binary count Do1 forms a digital signal corresponding to the analog signal voltage Vsig. The binary count Do1 is output from the counter 230 when the end signal Lout is activated, and is stored in the line buffer 300 in FIG. 1.

In addition, the activated end signal Lout deactivates the control signal S2 to the logic low state L such that the control switch SW2 is opened. Thus, the bias voltage VB is uncoupled from the bias transistors T3 and T13 that turn off for deactivating the first and second differential comparators 212 and 213. Such deactivated differential comparators 212 and 213 do not dissipate current for reducing power consumption of the analog-to-digital converter 200.

Also, the activated end signal Lout initially turns on the charge dissipation transistors T4 and T14. Such charge dissipation transistors T4 and T14 conduct charge at the gates of the bias transistors T3 and T13 to the ground node after the control switch SW2 is opened until the charge dissipation transistors T4 and T14 turn off from such charge dissipation.

Furthermore, the activated end signal Lout forms the control signal S1 that closes the fixing switch SW1. Thus, the high power voltage VDD is applied on the input of the latch 221 such that the end signal Lout remains activated to the logic high state H even after the first and second differential comparators 212 and 213 are deactivated.

Accordingly, the end signal Lout remains activated to the logic high state H for a latch time period and a horizontal blank time period, and until the next horizontal scan time period. For such a next horizontal scan time period, a logic high pulse is generated by the CIS controller 400 that controls the ramp signal generator 500 to generate the ramp voltage Vramp to have a relatively low constant level again. Thus, the end signal Lout is deactivated to the logic low state L, and the above-described operation repeats for such a next horizontal scan time period.

In this manner, the first and second differential comparators 212 and 213 in the analog-to-digital converter 200 of the present invention are turned on only for a portion of every horizontal scan time period. The deactivation of the first and second differential comparators 212 and 213 for a substantial portion of every horizontal scan time period significantly reduces power consumption in the analog-to-digital converter 200 of the present invention.

The foregoing is by way of example only and is not intended to be limiting. For example, any numbers or number of elements described and illustrated herein is by way of example only. In addition, the present invention has been described for the CDS analog-to-digital converter 200 being used within the CMOS image sensor 10. However, the CDS analog-to-digital converter 200 may also advantageously be applied for other electronic devices or applications for reducing power consumption therein.

The present invention is limited only as defined in the following claims and equivalents thereof.

What is claimed is:

1. An analog-to-digital converter, comprising:
   a comparator that is turned on by an applied bias voltage
      for comparing an analog voltage with a ramp voltage;

a latch that activates an end signal when the ramp voltage becomes greater than the analog voltage; and a bias control unit that uncouples the bias voltage from the comparator when the end signal is activated.

2. The analog-to-digital converter of claim 1, wherein the comparator become deactivated when the bias voltage is uncoupled for reducing power consumption.

3. The analog-to-digital converter of claim 1, further comprising:

a counter that counts from when the ramp voltage starts to ramp up until the end signal is activated, for generating a digital signal corresponding to the analog voltage.

4. The analog-to-digital converter of claim 1, further comprising:

a CDS (correlated double sampling) unit that generates the analog voltage as a difference between a reset voltage and a data voltage.

5. The analog-to-digital converter of claim 1, wherein the bias control unit includes a switch having a first terminal with the bias voltage applied thereon, and having a second terminal coupled to the comparator, and wherein the switch is controlled to be opened by the activated end signal.

6. The analog-to-digital converter of claim 1, wherein the comparator includes:

a first differential comparator with inputs having the analog and ramp voltages applied thereon; and a second differential comparator with inputs coupled to outputs of the first differential comparator, and wherein an output of the second differential comparator transitions when the ramp voltage becomes greater than the analog voltage.

7. The analog-to-digital converter of claim 6, wherein the first differential comparator includes a first differentially coupled pair of transistors and a first bias transistor having a gate couple to the bias control unit, and wherein the second differential comparator includes a second differentially coupled pair of transistors and a second bias transistor having a gate couple to the bias control unit.

8. The analog-to-digital converter of claim 7, wherein the first differential comparator further includes a first charge dissipation transistor coupled to the first bias transistor, and wherein the second differential comparator further includes a second charge dissipation transistor coupled to the second bias transistor, and wherein the first and second charge dissipation transistors are turned on when the end signal is activated for dissipating charge from the first and second bias transistors.

9. The analog-to-digital converter of claim 1, further comprising:

an input fixing unit that couples a predetermined voltage to an input of the latch such that the latch maintains the end signal to be activated after the bias voltage is uncoupled from the comparator.

10. The analog-to-digital converter of claim 9, wherein the input fixing unit includes a switch having a first terminal with the predetermined voltage applied thereon, and having a second terminal coupled to the input of the latch, and wherein the switch is controlled to be closed by the activated end signal.

11. The analog-to-digital converter of claim 1, wherein the analog-to-digital converter is formed within a CMOS (complementary metal oxide semiconductor) image sensor with the analog voltage indicating a gray scale level sensed by a photo-diode.

12. The analog-to-digital converter of claim 11, wherein the comparator is turned on for a portion of every horizontal scan time period.

13. A CMOS (complementary metal oxide semiconductor) image sensor, comprising:

a pixel circuit that generates a reset voltage and a data voltage;

a ramp signal generator for generating a ramp voltage; and an analog-to-digital converter including:

a CDS (correlated double sampling) unit that generates an analog voltage as a difference between the reset and data voltages;

a comparator that is turned on by an applied bias voltage for comparing the analog voltage with the ramp voltage;

a latch that activates an end signal when the ramp voltage becomes greater than the analog voltage; and a bias control unit that uncouples the bias voltage from the comparator when the end signal is activated.

14. The CMOS image sensor of claim 13, wherein the analog-to-digital converter further includes:

a counter that counts from when the ramp voltage starts to ramp up until the end signal is activated, for generating a digital signal corresponding to the analog voltage.

15. The CMOS image sensor of claim 13, wherein the analog-to-digital converter further includes:

an input fixing unit that couples a predetermined voltage to an input of the latch such that the latch maintains the end signal to be activated after the bias voltage is uncoupled from the comparator.

16. The CMOS image sensor of claim 13, wherein the comparator is turned on for a portion of every horizontal scan time period.

17. A method of converting an analog voltage into a digital signal, comprising:

applying a bias voltage on a comparator that compares the analog voltage with a ramp voltage;

activating an end signal when the ramp voltage becomes greater than the analog voltage as indicated by the comparator; and uncoupling the bias voltage from the comparator when the end signal is activated.

18. The method of claim 17, further comprising:

counting from when the ramp voltage starts to ramp up until the end signal is activated, for generating a digital signal corresponding to the analog voltage.

19. The method of claim 17, further comprising:

generating the analog voltage as a difference between a reset voltage and a data voltage.

20. The method of claim 17, further comprising:

maintaining the end signal to be activated after the bias voltage is uncoupled from the comparator.

21. The method of claim 17, wherein the analog voltage indicates a gray scale level sensed by a photo-diode within a CMOS (complementary metal oxide semiconductor) image sensor.

22. The method of claim 21, further comprising:

deactivating the end signal for a portion of every horizontal scan time period.

* * * * *